US011522162B2

(12) United States Patent
Tanaka et al.

(10) Patent No.: US 11,522,162 B2
(45) Date of Patent: Dec. 6, 2022

(54) DISPLAY DEVICE WITH WIRING LINE BETWEEN ISLANDS IN BENDING REGION

(71) Applicant: SHARP KABUSHIKI KAISHA, Sakai (JP)

(72) Inventors: Tetsunori Tanaka, Sakai (JP); Yukinobu Nakata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 208 days.

(21) Appl. No.: 17/042,868

(22) PCT Filed: Mar. 30, 2018

(86) PCT No.: PCT/JP2018/013842
§ 371 (c)(1),
(2) Date: Sep. 28, 2020

(87) PCT Pub. No.: WO2019/187086
PCT Pub. Date: Oct. 3, 2019

(65) Prior Publication Data
US 2021/0057675 A1 Feb. 25, 2021

(51) Int. Cl.
H01L 51/52 (2006.01)
H01L 27/32 (2006.01)

(52) U.S. Cl.
CPC ...... H01L 51/5253 (2013.01); H01L 27/3276 (2013.01)

(58) Field of Classification Search
CPC .......... H01L 51/5253; H01L 27/3276
See application file for complete search history.

(56) References Cited

U.S. PATENT DOCUMENTS

| 2014/0353670 | A1 | 12/2014 | Youn et al. | |
|---|---|---|---|---|
| 2015/0287750 | A1 | 10/2015 | Youn et al. | |
| 2016/0218305 | A1* | 7/2016 | Kim | G02F 1/1345 |
| 2017/0237025 | A1* | 8/2017 | Choi | H01L 27/3276 257/40 |
| 2017/0352717 | A1* | 12/2017 | Choi | H01L 27/3276 |
| 2018/0061917 | A1* | 3/2018 | Kim | H01L 27/3258 |
| 2018/0337223 | A1* | 11/2018 | Lee | H01L 27/3276 |
| 2021/0098553 | A1* | 4/2021 | Yamanaka | H05B 33/02 |

FOREIGN PATENT DOCUMENTS

JP 2014-232300 A 12/2014

\* cited by examiner

Primary Examiner — Lex H Malsawma
(74) Attorney, Agent, or Firm — ScienBiziP, P.C.

(57) ABSTRACT

In a bending region provided in a frame region, an opening is formed in an inorganic layered film, a plurality of residual layers of the inorganic layered film are provided in island shapes in a plan view in the opening, and a frame wiring line is disposed between the adjacent residual layers.

12 Claims, 10 Drawing Sheets

DISPLAY DEVICE WITH WIRING LINE BETWEEN ISLANDS IN BENDING REGION

TECHNICAL FIELD

The disclosure relates to a display device.

BACKGROUND ART

In recent years, organic EL display devices, which use organic electroluminescence (EL) elements and are of the self-luminous type, have attracted attention as a display device that can replace the liquid crystal display device. As the organic EL display device, an organic EL display device having flexibility in which an organic EL element, a variety of films and the like are layered on a flexible resin substrate, has been proposed. In the organic EL display device, there are provided a rectangular display region for displaying an image and a frame region formed around the display region, where reduction of the frame region is demanded. In the organic EL display device having flexibility, for example, if the frame region is reduced by bending the frame region located on the terminal side, the wiring line arranged in the frame region may be broken.

For example, PTL 1 discloses a flexible display device in which a bending hole is so formed as to remove part of each of a buffer film, a gate insulating film, and an interlayer insulating film corresponding to a bending region, thereby preventing disconnection of the wiring line.

CITATION LIST

Patent Literature

PTL JP 2014-232300 A

SUMMARY

Technical Problem

In a flexible organic EL display device, a resin substrate having a layered structure in which an inorganic insulating film is interposed between two layers of resin films is used in order to impart a moisture-proof function to a display region. Inorganic films such as a base coat film, a gate insulating film, and an interlayer insulating film are provided on a front face of the resin substrate.

In order to suppress breakage of a wiring line disposed in a frame region, in a bending region provided in the frame region, the inorganic film is removed, a flattening film is formed in the removed portion, and the wiring line is formed on the flattening film in some case.

In this case, since the inorganic film is not present on a front face of the upper-layer side resin film of the resin substrate in the bending region, the upper-layer side resin film absorbs moisture in a water washing step during the manufacture, so that the adhesion between the upper-layer side resin film and the inorganic insulating film on a hack face of the upper-layer side resin film may be lowered. As a result, in a bending step during the manufacture, peeling occurs at the interface between the upper-layer side resin film and the inorganic insulating film, thereby raising a problem that the production yield of the display device decreases.

The disclosure has been conceived in view of the above point, and an object thereof is to suppress a decrease in production yield of a display device by improving a structure of an inorganic film provided on a front face of a resin substrate in a bending region.

Solution to Problem

In order to accomplish the above object, a display device according to the disclosure includes: a resin substrate in which a first resin film, an inorganic insulating film, and a second resin film are layered in that order; a light-emitting element included in a display region that is provided over the resin substrate with a TFT layer interposed between the display region and the resin substrate; a frame region provided in a periphery of the display region; a terminal section provided at an end portion of the frame region; a bending region provided between the display region and the terminal section; at least one layer of an inorganic film provided in the frame region and included in the TFT layer that is layered on a front face of the resin substrate; a frame flattening film provided on the front face of the resin substrate to cover the inorganic film; and a frame wiring line that is provided on a front face of the inorganic film and a front face of the frame flattening film, is connected to the light-emitting element, and is extended to the terminal section. Further, in the bending region, openings are formed in the inorganic film, a plurality of residual layers of the inorganic film are provided in island shapes in the openings in a plan view, and the frame wiring line is disposed between the residual layers adjacent to each other.

Advantageous Effects of Disclosure

According to the disclosure, in the bending step, the occurrence of peeling at the interface between the second resin film and the inorganic insulating film can be suppressed, and a reduction in production yield of the display device can be suppressed.

DESCRIPTION OF EMBODIMENTS

Embodiments of the disclosure will be described below in detail with reference to the drawings. The disclosure is not limited to the embodiments described below.

First Embodiment

Figure 1:
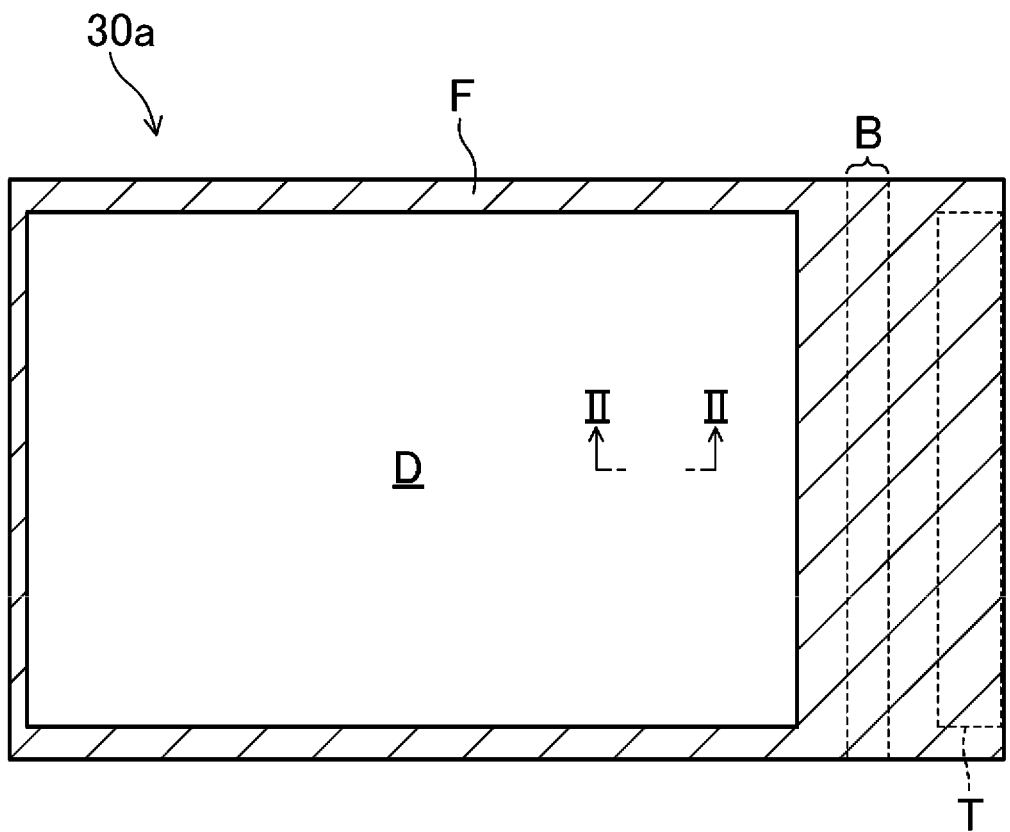
FIG. 1 is a plan view of an organic EL display device according to a first embodiment of the disclosure.
Figure 2:
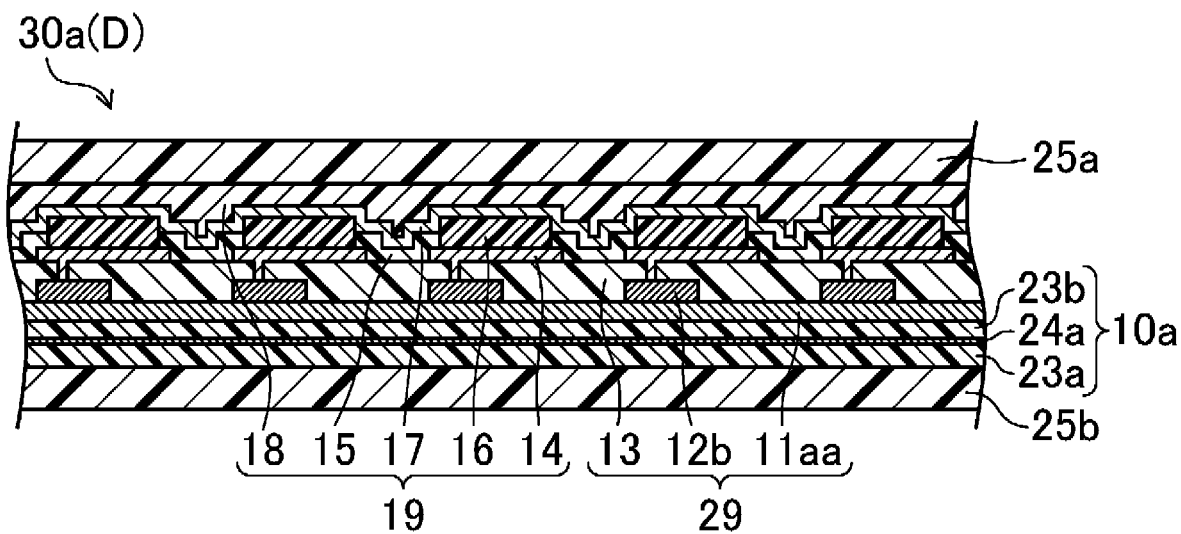
FIG. 2 is a cross-sectional view of the organic EL display device taken along a line II-II in FIG. 1.
Figure 3:
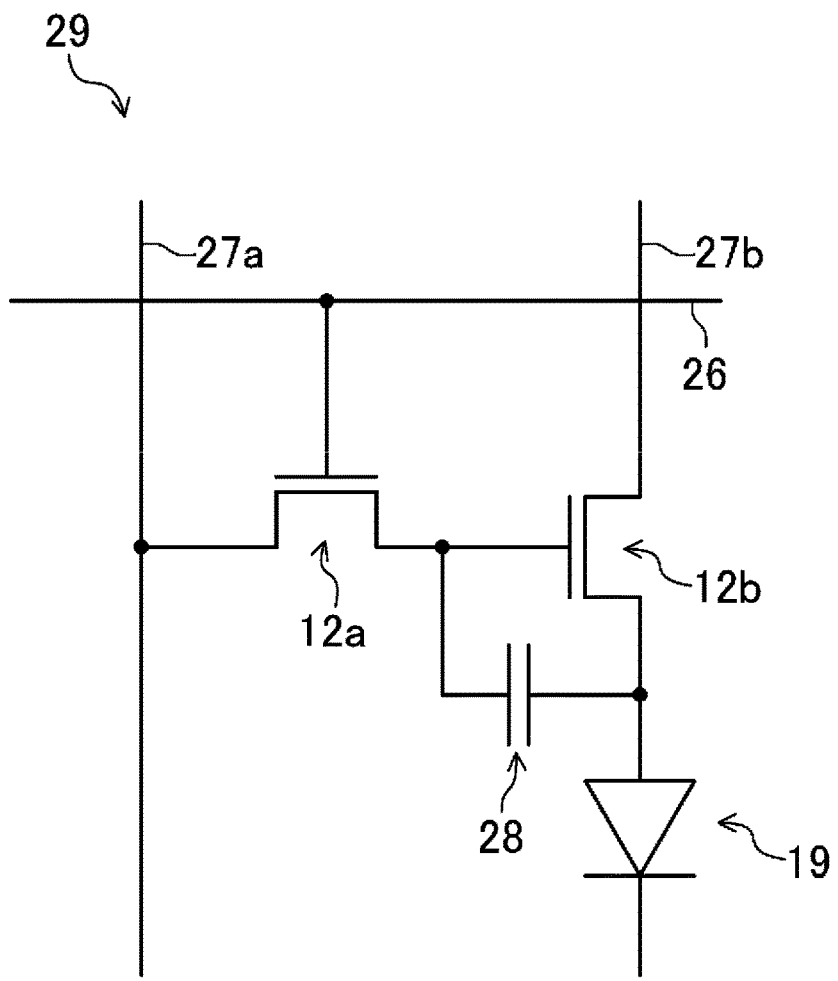
FIG. 3 is an equivalent circuit diagram of a TFT layer included in the organic EL display device according to the first embodiment of the disclosure.
Figure 4:
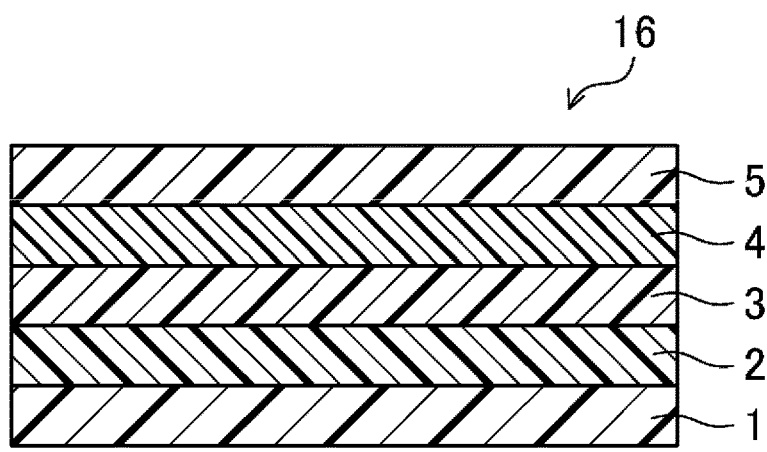
FIG. 4 is a cross-sectional view illustrating an organic EL layer included in the organic EL display device according to the first embodiment of the disclosure.
Figure 5:
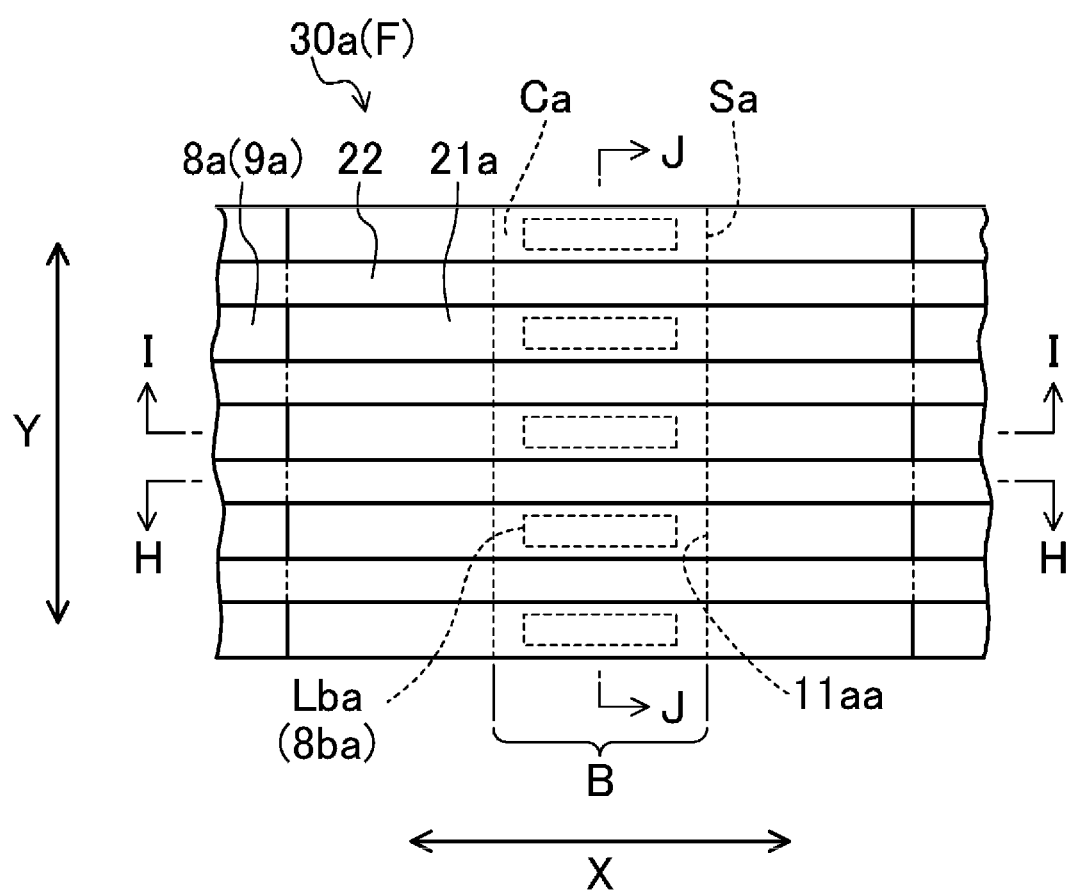
FIG. 5 is a plan view illustrating a bending region in a frame region of the organic EL display device according to the first embodiment of the disclosure.
Figure 6:
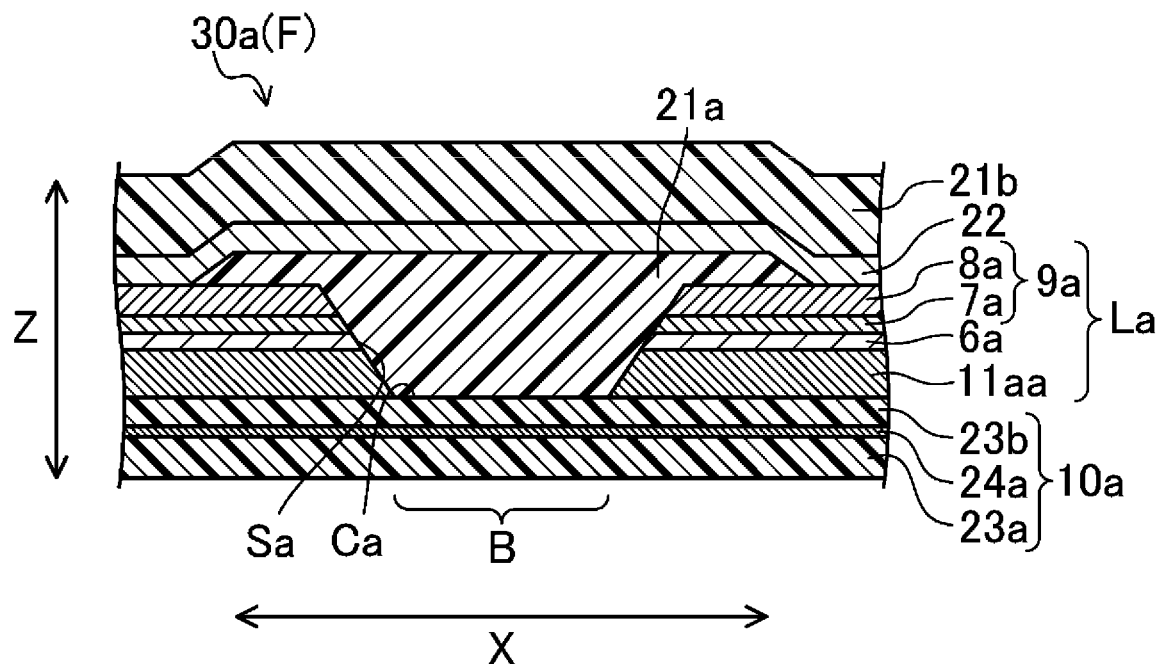
FIG. 6 is a cross-sectional view illustrating the bending region of the organic EL display device according to the first embodiment of the disclosure, and is a cross-sectional view taken along a line H-H in FIG. 5.
Figure 7:
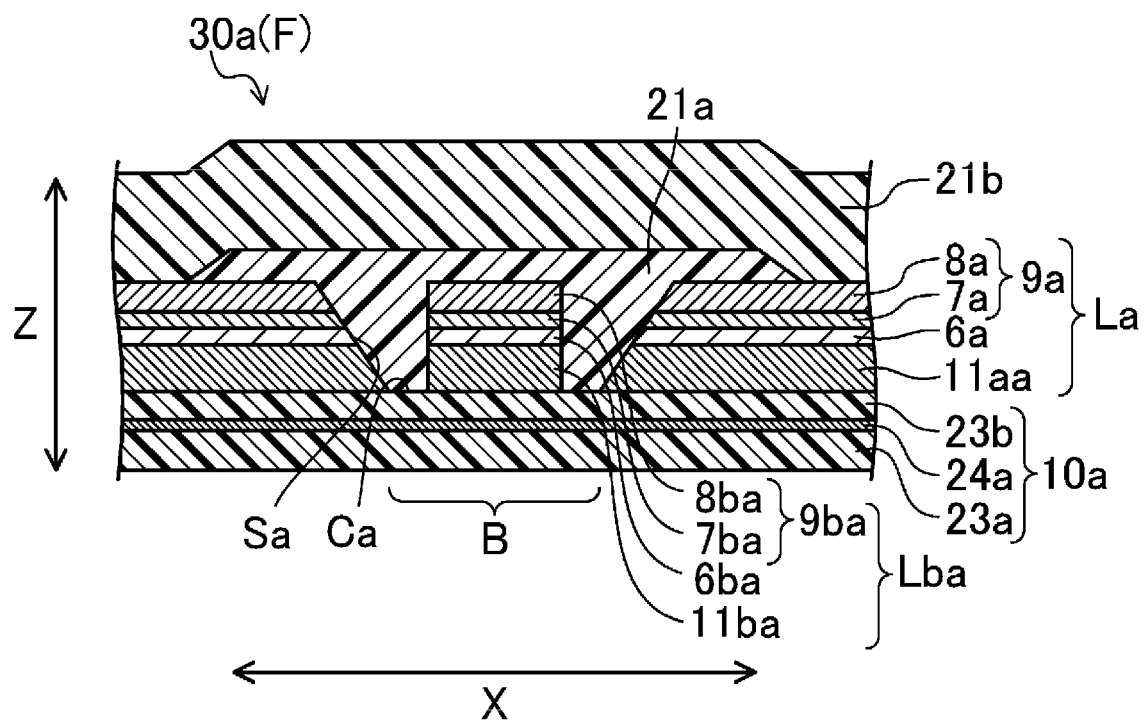
FIG. 7 is a cross-sectional view illustrating the bending region of the organic EL display device according to the first embodiment of the disclosure, and is a cross-sectional view taken along a line I-I in FIG. 5.
Figure 8:
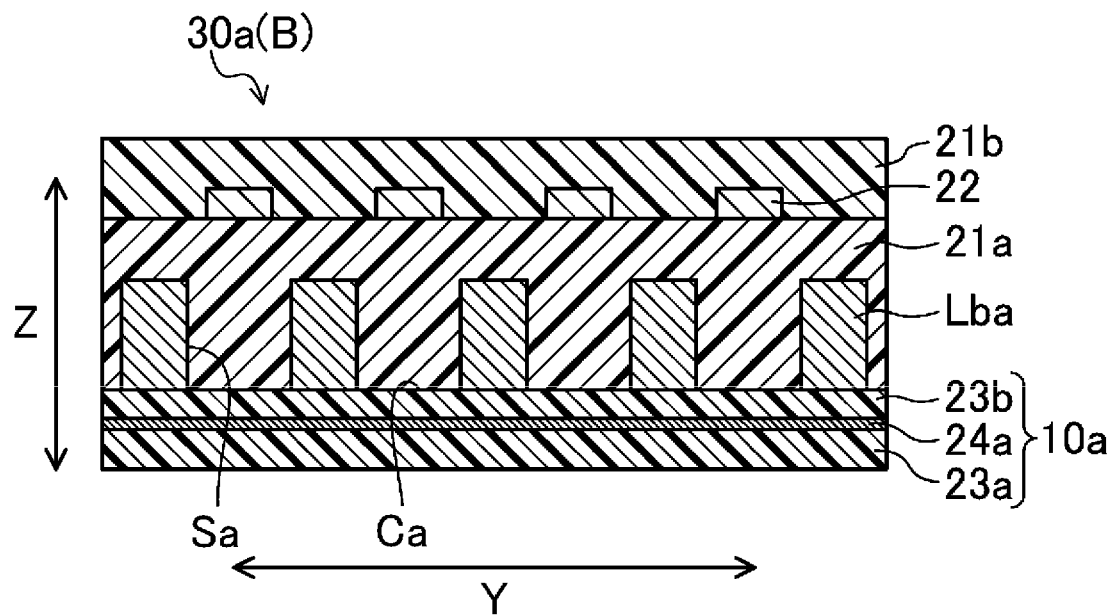
FIG. 8 is an enlarged cross-sectional view illustrating only the bending region of the organic EL display device according to the first embodiment of the disclosure, and is an enlarged cross-sectional view taken along a line J-J in FIG. 5.
Figure 9:
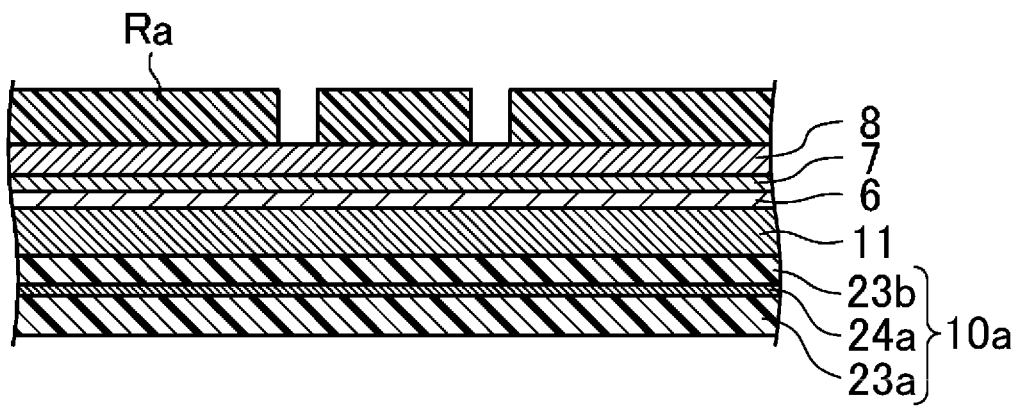
FIG. 9 is a cross-sectional view illustrating a first step for forming a residual layer of an inorganic layered film included in the organic EL display device according to the first embodiment of the disclosure, and is a cross-sectional view taken along the line I-I in FIG. 5.
Figure 10:
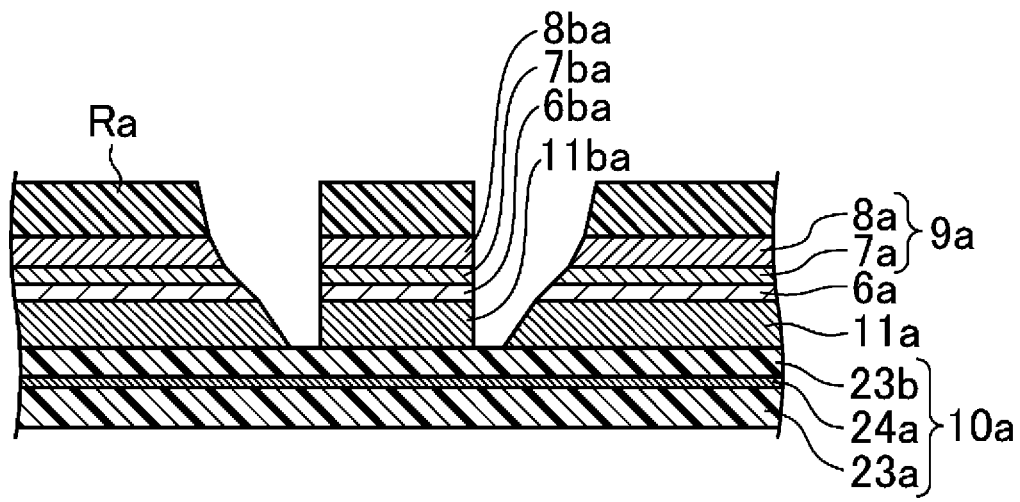
FIG. 10 is a cross-sectional view illustrating a second step for forming the residual layer of the inorganic layered film included in the organic EL display device according to the first embodiment of the disclosure, and is a cross-sectional view taken along the line I-I in FIG. 5.
Figure 11:
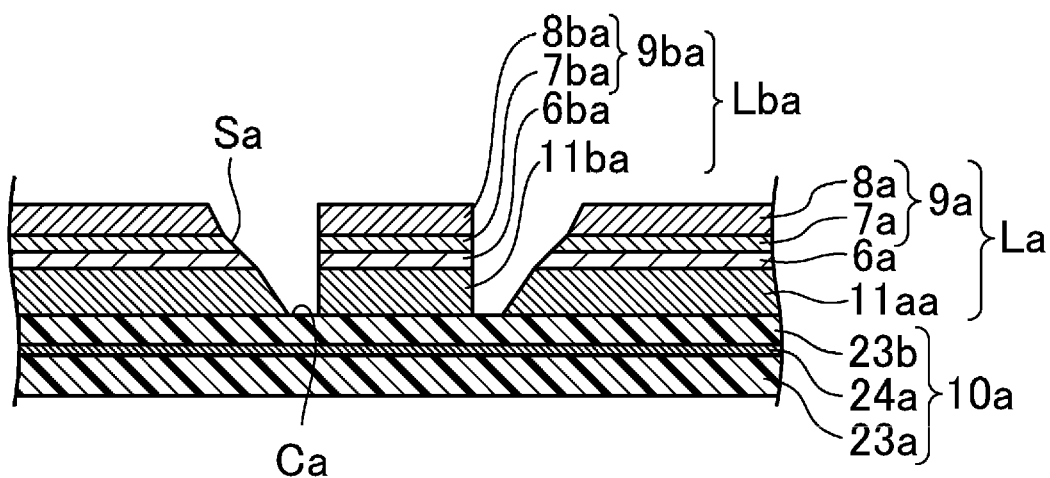
FIG. 11 is a cross-sectional view illustrating a third step for forming the residual layer of the inorganic layered film included in the organic EL display device according to the first embodiment of the disclosure, and is a cross-sectional view taken along the line I-I in FIG. 5.

FIGS. 1 to 11 illustrate a first embodiment of a display device according to the disclosure. Note that, in each of the following embodiments, an organic EL display device including an organic EL element will be described as a display device including a light-emitting element. FIG. 1 is a plan view of an organic EL display device 30a according to the present embodiment. FIG. 2 is a cross-sectional view of the organic EL display device 30a taken along a line II-II in FIG. 1. FIG. 3 is an equivalent circuit diagram of a TFT layer 29 included in the organic EL display device 30a. FIG. 4 is a cross-sectional view of an organic EL layer 16 included in the organic EL display device 30a. FIG. 5 is a plan view illustrating a bending region B in a frame region F of the organic EL display device 30a. FIG. 6 is a cross-sectional view illustrating the bending region B of the organic EL display device 30a, and is a cross-sectional view taken along a line H-H in FIG. 5. FIG. 7 is a cross-sectional view illustrating the bending region B of the organic EL display device 30a, and is a cross-sectional view taken along a line I-I in FIG. 5. FIG. 8 is an enlarged cross-sectional view illustrating only the bending region B of the organic EL display device 30a, and is an enlarged cross-sectional view taken along a line J-J in FIG. 5. FIG. 9, FIG. 10, and FIG. 11 are cross-sectional views illustrating first, second, and third steps, respectively, for forming a residual layer Lba of an inorganic layered film La included in the organic EL display device 30a, and are each a cross-sectional view taken along the line I-I in FIG. 5.

As illustrated in FIG. 1, the organic EL display device 30a includes a display region D defined to have a rectangular shape and configured to display an image, and the frame region F defined in the periphery of the display region D (a hatched portion in the figure). Here, as illustrated in FIG. 2, the display region D of the organic EL display device 30a is provided with organic EL elements 19 and a plurality of pixels arranged in a matrix shape. Note that each of the pixels in the display region D includes, for example, a subpixel for display of red grayscale, a subpixel for display of green grayscale, and a subpixel for display of blue grayscale. These subpixels are arrayed adjacent to one another. As illustrated in FIG. 1, a terminal section T is provided at the right end portion of the frame region F in the figure. Further, as illustrated in FIG. 1, between the display region D and the terminal section T in the frame region F, the bending region B bendable at 180 degrees (in a U shape) about a bending axis being a vertical direction in the figure is provided along one side (the right side in the figure) of the display region D. In the present specification, the bending region B refers to an entire U-shaped region including a portion bent in a U shape and a portion extending from the bent portion toward the display region D.

As illustrated in FIG. 2, the organic EL display device 30a includes, in the display, region D, a resin substrate layer 10a, the TFT layer 29 provided on a front face of the resin substrate layer 10a, the organic EL element 19 provided, as a light-emitting element, on a front face of the TFT layer 29, a front surface side protection layer 25a provided on a front face of the organic EL element 19, and a back surface side protection layer 25b provided on a back face of the resin substrate layer 10a.

As illustrated in FIG. 2, the resin substrate layer 10a is constituted by layering a first resin film 23a, an inorganic insulating film 24a, and a second resin film 23b in that order. The first resin film 23a and the second resin film 23b are each formed of, for example, an organic resin material such as a polyimide resin, an acrylic resin, a polysiloxane resin, or a novolac resin. The first resin film 23a and the second resin film 23b may be formed of the same organic resin material, or may be formed of different organic resin materials. It is preferable that the same organic resin material be used from a viewpoint of improving the adhesion between the first resin film 23a and the second resin film 23b. The thickness of the first resin film 23a is approximately 5 μm to 15 μm. The thickness of the second resin film 23b is approximately 5 μm to 15 μm.

The inorganic insulating film 24a is formed with silicon oxide ($SiO_2$), silicon nitride (SiNx (x is a positive number))

such as trisilicon tetranitride ($Si_3N_4$), silicon oxynitride such as silicon oxynitride (SiNO), or the like. The thickness of the inorganic insulating film 24a is approximately 0.1 μm to 1 μm. The thickness of the resin substrate layer 10a is approximately 10 μm to 30 μm.

As illustrated in FIG. 2, the TFT layer 29 includes a base coat film 11aa provided on the resin substrate layer 10a, a plurality of first TFTs 12a (see FIG. 3) and a plurality of second TFTs 12b provided on the base coat film 11aa, and a TFT flattening film 13 provided on the first TFTs 12a and the second TFTs 12b. As illustrated in FIG. 3, the TFT layer 29 is provided with a plurality of gate lines 26 provided to extend in parallel to one another in the horizontal direction in the figure. As illustrated in FIG. 3, the TFT layer 29 is also provided with a plurality of source lines 27a provided to extend in parallel to one another in the vertical direction in the figure. As illustrated in FIG. 3, the TFT layer 29 is further provided with a plurality of power supply lines 27b each provided adjacent to each source line 27a to extend in parallel to one another in the vertical direction in the figure. As illustrated in FIG. 3, the TFT layer 29 is further provided with, in each subpixel, the first TFT 12a, the second TFT 12b, and a capacitor 28.

The base coat film 11aa is formed with, for example, a single layer film or a layered film of an inorganic film such as a silicon nitride film, a silicon oxide film, or a silicon oxynitride film.

As illustrated in FIG. 3, the first TFT 12a is connected to the corresponding gate line 26 and source line 27a in each subpixel. As illustrated in FIG. 3, the second TFT 12b is connected to the corresponding first TFT 12a and power supply line 27b in each subpixel. The first TFT 12a and the second TFT 12b each include, for example, a semiconductor layer provided in an island shape on the base coat film 11aa, a gate insulating film 6a (see FIG. 7) provided to cover the semiconductor layer, a gate electrode provided to partially overlap with the semiconductor layer on the gate insulating film 6a, an interlayer insulating film 9a (see FIG. 7) provided to cover the gate electrode, and a source electrode and a drain electrode provided in a manner spaced apart from each other on the interlayer insulating film 9a. Note that, although in the first embodiment, the top-gate type is described as an example of the first TFT 12a and the second TFT 12b, the first TFT 12a and the second TFT 12b may be of the bottom-gate type.

As illustrated in FIG. 3, the capacitor 28 is connected to the corresponding first TFT 12a and power supply line 27b in each subpixel. The capacitor 28 is formed with, for example, one electrode formed of the same material in the same layer as the gate electrode, the other electrode formed of the same material in the same layer as the source electrode and the drain electrode, and the interlayer insulating film 9a (see FIG. 7) provided between the pair of these electrodes.

The TFT flattening film 13 is formed with, for example, a colorless and transparent organic resin material such as a polyimide resin.

As illustrated in FIG. 2, the organic EL element 19 includes a plurality of first electrodes 14, an edge cover 15, a plurality of organic EL layers 16, a second electrode 17, and a sealing film 18, which are provided in that order over the TFT flattening film 13.

As illustrated in FIG. 2, the plurality of first electrodes 14 are provided, corresponding to a plurality of subpixels, in a matrix shape over the TFT flattening film 13. As illustrated in FIG. 2, the first electrode 14 is connected to the drain electrode of each TFT 12 via a contact hole formed in the TFT flattening film 13. The first electrode 14 functions to inject holes into the organic EL layer 16. It is further preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Examples of materials that constitute the first electrode 14 may include alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al). Examples of materials that may be included in the first electrode 14 include electrically conductive oxides, examples of which include tin oxide (SnO), zinc oxide (ZnO), indium tin oxide (ITO), and indium zinc oxide (IZO). The first electrode 14 may be formed by layering a plurality of layers of any of the above-mentioned materials. Note that, examples of materials having a large work function include indium tin oxide (ITO) and indium zinc oxide (IZO).

As illustrated in FIG. 2, the edge cover 15 is provided in a lattice pattern and surrounds the peripheral portion of each first electrode 14. Examples of materials that constitute the edge cover 15 include an inorganic film such as a silicon oxide ($SiO_2$) a silicon nitride (SiNx (x is a positive number)) film like a trisilicon tetranitride ($Si_3N_4$) film, or a silicon oxynitride (SiNO) film, and an organic film such as a polyimide resin film, an acrylic resin film, a polysiloxane resin film, or a novolac resin film.

As illustrated in FIG. 2, the plurality of organic EL layers 16 are provided in a matrix shape, each being arranged on each first electrode 14 and each corresponding to each subpixel. Here, as illustrated in FIG. 4, the organic EL layers 16 each include a hole injection layer 1, a hole transport layer 2, a light-emitting layer 3, an electron transport layer 4, and an electron injection layer 5, which are provided in the order stated, over the first electrode 14.

The hole injection layer 1 is also referred to as an anode buffer layer, and functions to reduce the energy level difference between the first electrode 14 and the organic EL layer 16, to improve the efficiency of hole injection into the organic EL layer 16 from the first electrode 14. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Here, examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region in which, when a voltage is applied via the first electrode 14 and the second electrode 17, holes and electrons are injected from the first electrode 14 and the second electrode 17 respectively, and the holes and the electrons recombine. The light-emitting layer 3 is formed of a material having high luminous efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce the energy level difference between the second electrode 17 and the organic EL layer 16, to improve the efficiency of electron injection into the organic EL layer 16 from the second electrode 17. Because of this function, the drive voltage for the organic EL element 19 can be reduced. Note that the electron injection layer 5 is also referred to as a cathode buffer layer. Examples of materials that constitute the electron injection layer 5 include inorganic alkali compounds such as lithium fluoride (LiF), magnesium fluoride (MgF$_2$), calcium fluoride (CaF$_2$), strontium fluoride (SrF$_2$), and barium fluoride (BaF$_2$); aluminum oxide (Al$_2$O$_3$); and strontium oxide (SrO).

As illustrated in FIG. 2, the second electrode 17 is disposed to cover the organic EL layers 16 and the edge cover 15, The second electrode 17 functions to inject electrons into the organic EL layer 16. It is further preferable that the second electrode 17 include a material having a small work function to improve the efficiency of electron injection into the organic EL layer 16. Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 17 may be formed of an alloy such as magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), or lithium fluoride (LiF)/calcium (Ca)/aluminum (Al), for example. Examples of materials that may be included in the second electrode 17 include electrically conductive oxides, examples of which include tin oxide (SnO), zinc oxide (ZnO), indium tin oxide (ITO), and indium zinc oxide (IZO). The second electrode 17 may be formed by layering a plurality of layers of any of the above-mentioned materials.

Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 2, the sealing film 18 is provided to cover the second electrode 17, and functions to protect the organic EL layer 16 from moisture and oxygen. Examples of materials that may be included in the sealing film 18 include inorganic materials, examples of which include silicon oxide (Sift), aluminum oxide (Al$_2$O$_3$), silicon nitride (SiNx (x is a positive number)) like trisilicon tetranitride (Si$_3$N$_4$), and silicon carbonitride (SiCN); and organic materials, examples of which include acrylate, polyurea, parylene, polyimide, and polyamide.

The front surface side protection layer 25a and the back surface side protection layer 25b are each formed with, for example, a polyimide resin film or the like with a thickness of approximately 2 μm.

As illustrated in FIGS. 5 and 6, the organic EL display device 30a includes, in the frame region F, the resin substrate layer 10a, an inorganic layered film La and a first flattening film (frame flattening film) 21a provided on the front face of the resin substrate layer 10a, a frame wiring line 22 provided on the front faces of the inorganic layered film La and the first flattening film 21a, and a second flattening film 21b provided to cover the frame wiring line 22. Note that, in the plan view of FIG. 5, the second flattening film 21b on the frame wiring line 22 is omitted.

The frame wiring line 22 is connected to signal wiring lines (for example, the gate line, source line, and power supply line) of the organic EL element 19 in the display region D, and is extended to the terminal section T. The frame wiring line 22 is formed with, for example, a metal layered film of a titanium film (with a thickness of approximately 200 nm)/an aluminum film (with a thickness of approximately 100 nm)/a titanium film (with a thickness of approximately 200 nm). Note that, although in the first embodiment, the example of the frame wiring line 22 formed with a metal layered film is given, the frame wiring line 22 may also be formed with a metal single layer film.

The inorganic layered film La is at least one layer of an inorganic film included in the TFT layer 29, and includes, as illustrated in FIGS. 6 and 7, the base coat film 11aa (first inorganic layer), the gate insulating film 6a (second inorganic layer), and the interlayer insulating film 9a formed of a first interlayer insulating film 7a (third inorganic layer) and a second interlayer insulating film 8a (fourth inorganic layer), which are layered in that order over the resin substrate layer 10a. That is, the inorganic layered film La is constituted by four layers of inorganic layers.

In the present embodiment, as illustrated in FIGS. 6 and 7, in the bending region B, the base coat film 11aa, the gate insulating film 6a, and the interlayer insulating film 9a of the inorganic layered film La are not provided, but an opening Sa is formed. As illustrated in FIGS. 6 and 7, the opening Sa is formed in the manner passing through the inorganic layered film La in a thickness direction Z thereof.

In the present embodiment, as illustrated in FIGS. 5 and 8, in a plan view, a plurality (five in FIGS. 5 and 8) of residual layers Lba of the inorganic layered film La are provided in island shapes in the openings Sa, and the frame wiring line 22 is disposed between the adjacent residual layers Lba.

As illustrated in FIG. 7, the residual layer Lba is an inorganic film formed of at least one layer of the inorganic layered film La, and includes a base coat film 11*ba*, a gate insulating film 6*ba*, and an interlayer insulating film 9*ba* formed of a first interlayer insulating film 7*ba* and a second interlayer insulating film 8*ba*, which are layered in that order over the resin substrate layer 10*a*.

Accordingly, in a second resin film 23*b* in the opening Sa, moisture absorption is suppressed at a portion having the residual layer Lba on a front face thereof in comparison with a portion Ca not having the residual layer Lba, illustrated in FIGS. 7 and 8, on the front face thereof (hereinafter referred to as a "cutout portion" Ca), so that the adhesion with the inorganic insulating film 24*a* present on a back face thereof is enhanced.

As described above, in the second resin film 23*b* in the opening Sa, even when a portion inferior in adhesion with the inorganic insulating film 24*a* (the cutout portion Ca) is partially present, by providing a portion excellent in adhesion with the inorganic insulating film 24*a* (a portion having the residual layer Lba on the front face) adjacent to the portion inferior in the adhesion, the adhesion with the inorganic insulating film 24*a* is maintained throughout the entire second resin film 23*b* in the opening Sa. This makes it possible to suppress the occurrence of peeling at the interface between the second resin film 23*b* and the inorganic insulating film 24*a* caused by the bending of the resin substrate layer 10*a* in the bending region B.

As described above; the frame wiring line 22 is disposed between the adjacent residual layers Lba in a plan view, as illustrated in FIGS. 5 and 8. In other words, the residual layer Lba is provided at a portion where the frame wiring line 22 is not disposed in a plan view. In this manner, in the plan view, the plurality of residual layers Lba provided in island shapes do not overlap with the frame wiring line 22, thereby making it possible to reduce the stress exerted on the residual layers Lba when the resin substrate layer 10*a* is bent. This makes it possible to suppress breakage of the residual layer Lba caused by the bending of the resin substrate layer 10*a* in the bending region B.

As illustrated in FIG. 7, the first flattening film 21*a* is so provided as to cover the residual layer Lba and to fill the opening Sa. The second resin film 23*b* is exposed at the cutout portion Ca in the opening Sa, and the first flattening film 21*a* is provided in such a manner that the first flattening film 21*a* and the second resin film 23*b* are in direct contact with each other. In other words, the opening Sa is a through-hole that causes the second resin film 23*b* and the first flattening film 21*a* to make direct contact with each other at the cutout portion Ca.

The first flattening film 21*a* and the second flattening film 21*b* are each formed with, for example, an organic insulating film such as a polyimide resin film with a thickness of approximately 2 μm.

The front surface side protection layer 25*a* and the back surface side protection layer 25*b*, which are disposed in the display region are also provided in the most part of the frame region F, but are not provided in the bending region B.

The organic EL display device 30*a* described above has flexibility, and is configured, in each subpixel, such that the light-emitting layer 3 of the organic EL layer 16 is caused to appropriately emit light via the first TFT 12*a* and the second TFT 12*b* so that images are displayed.

The organic EL display device 30*a* of the present embodiment can be manufactured as described below.

For example, first, by using a known method, the first resin film 23*a* is formed on a glass substrate, the inorganic insulating film 24*a* is formed on the first resin film 23*a*, and the second resin film 23*b* is formed on the inorganic insulating film 24*a*, thereby forming the resin substrate layer 10*a*; next, on the front face of the resin substrate layer 10*a* having been formed, by using a known method, the base coat film 11*aa* and the organic EL element 19 are formed, the front surface side protection layer 25*a* is attached onto the organic EL element 19 with an adhesive layer interposed therebetween, and then the back surface side protection layer 25*b* is attached onto the back face of the resin substrate layer 10*a*, from which the glass substrate has been peeled off, with an adhesive layer interposed therebetween, thereby making it possible to manufacture the organic EL display device 30*a*. The frame wiring line 22 of the frame region F is formed when the source electrode and the drain electrode of the TFT 12, which is included in the organic EL element 19, are formed. The first flattening film 21*a* in the frame region F is formed, before the formation of the source electrode and the drain electrode of the TFT 12 included in the organic EL element 19, by film-forming a photosensitive organic insulating film such as a polyimide resin film only in the frame region F and by patterning.

The residual layer Lba of the inorganic layered film La in the bending region B is formed, for example, as follows. First, as illustrated in FIG. 9, a resist is applied onto a layered film of an inorganic insulating film 11, an inorganic insulating film 6, an inorganic insulating film 7, and an inorganic insulating film 8, which are film-formed on the resin substrate layer 10*a*, so as to form a resist pattern Ra by using a photolithography method. The inorganic insulating film 11 is formed with, for example, a layered film of a silicon oxide film (upper layer)/a silicon nitride film (middle layer)/a silicon oxide film (lower layer), or the like. The inorganic insulating film 6 is formed with, for example, a single layer film such as a silicon nitride film. The inorganic insulating film 7 is formed with, for example, a single layer film such as a silicon nitride film. The inorganic insulating film 8 is formed with, for example, a layered film of a silicon nitride film (upper layer)/a silicon oxide film (lower layer).

Subsequently, inorganic insulating films 11, 6, 7, and 8 exposed from the resist pattern Ra are removed by dry etching, and, as illustrated in FIG. 10, an inorganic insulating film 11*a*, the gate insulating film 6*a*, the first interlayer insulating film 7*a*, and the second interlayer insulating film 8*a* are formed. Furthermore, the base coat film 11*ba*, the gate insulating film 6*ba*, the first interlayer insulating film 7*ba*, and the second interlayer insulating film 8*ba* separated from the inorganic insulating film 11*a*, the gate insulating film 6*a*, the first interlayer insulating film 7*a*, and the second interlayer insulating film 8*a*, respectively, are formed.

Finally, as illustrated in FIG. 11, by peeling off the resist pattern Ra, the opening Sa is formed in the inorganic layered film La in the bending region B, and the residual layer Lba constituted of four layers can be formed in the opening Sa. The residual layer Lba is formed to have a thickness of approximately 1.5 μm.

The organic EL display device 30*a* of the present embodiment described above is able to achieve the following effects (1) and (2).

(1) The opening Sa is formed in the inorganic layered film La in the bending region B; in a plan view, the plurality of residual layers Lba each formed of at least one layer of the inorganic layered film La are formed in island shapes in the opening Sa, and the frame wiring line 22 is disposed between the adjacent residual layers Lba. Accordingly, in the second resin film 23*b* in the opening Sa, moisture absorption is suppressed at a portion with the residual layer Lba provided on the front face thereof in comparison with the cutout portion Ca, so that the adhesion with the inorganic insulating film 24a present on the back face thereof is enhanced. As a result, the adhesion with the inorganic insulating film 24a is maintained throughout the second resin film 23h in the opening Sa. As described above, since the occurrence of peeling at the interface between the second resin film 23b and the inorganic insulating film 24a caused by the bending of the resin substrate layer 10a in the bending region B can be suppressed, the reduction in production yield of the organic EL display device 30a may be suppressed.

(2) In a plan view, the frame wiring line 22 is disposed between the adjacent residual layers Lba (that is, the residual layer Lba is provided in a portion where the frame wiring line 22 is not disposed in the plan view). Therefore, the plurality of residual layers Lba provided in island shapes do not overlap with the frame wiring line 22 in the plan view, thereby making it possible to reduce the stress exerted on the residual layers Lba when the resin substrate layer 10a is bent. As a result, since the breakage of the residual layer Lba caused by the bending of the resin substrate layer 10a can be suppressed in the bending region B, the reduction in production yield of the organic EL display device 30a may be suppressed.

Second Embodiment

Figure 12:
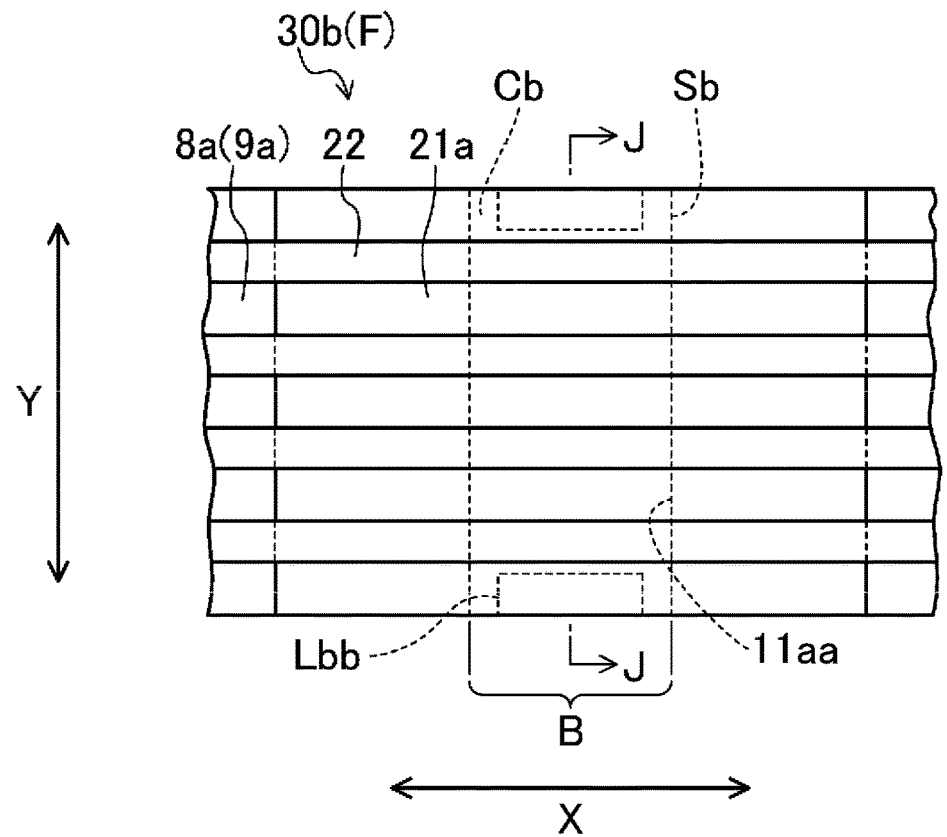
FIG. 12 is a plan view illustrating a bending region in a frame region of an organic EL display device according to a second embodiment of the disclosure, and is a view corresponding to FIG. 5.
Figure 13:
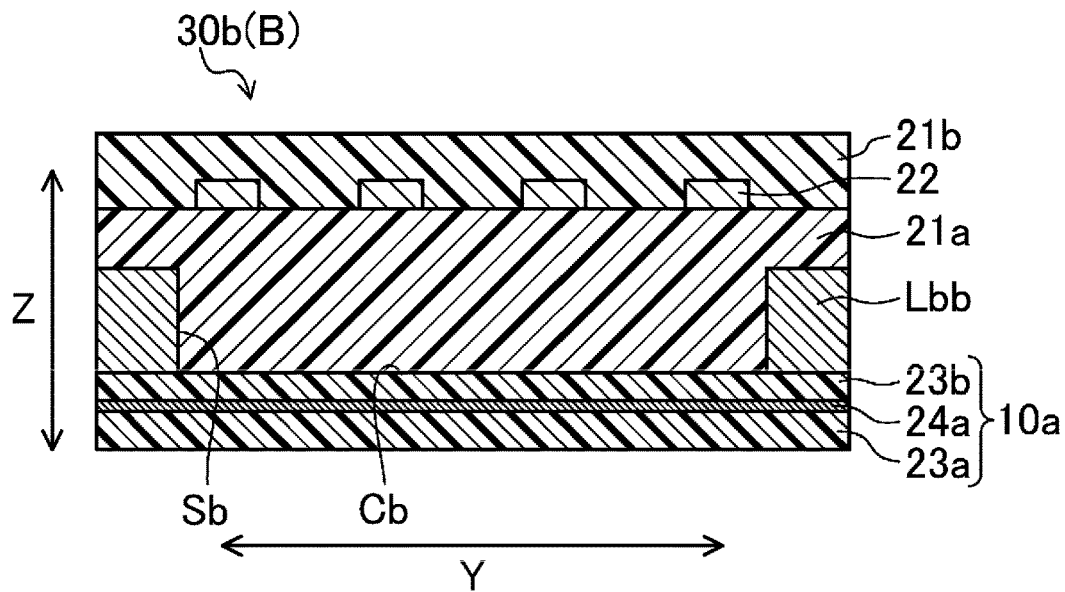
FIG. 13 is an enlarged cross-sectional view illustrating only the bending region of the organic EL display device according to the second embodiment of the disclosure taken along a line J-J in FIG. 12, and is a view corresponding to FIG. 8.

A second embodiment of the disclosure will be described below. FIG. 12 is a plan view illustrating a bending region B in a frame region F of an organic EL display device 30b according to the present embodiment, and is a view corresponding to FIG. 5. FIG. 13 is an enlarged cross-sectional view illustrating only the bending region B of the organic EL display device 30b taken along a line J-J in FIG. 12, and is a view corresponding to FIG. 8. The overall configuration, excluding the bending region B, of the organic EL display device 30b including the display region D, the frame region F, and the like is the same as that of the first embodiment described above, and therefore detailed description thereof will be omitted. Note that elements common to those in the first embodiment are denoted by the same reference signs, and duplicated description thereof will be omitted.

In the organic EL display device 30b of the present embodiment, as illustrated in FIGS. 12 and 13, it is to be noted that, in an opening Sb, residual layers Lbb are provided at least at both ends in a direction Y substantially orthogonal to an extension direction X of a frame wiring line 22. More specifically, in the opening Sb, the residual layers Lbb are provided only at both the ends in the direction Y of the organic EL display device 30b in such a manner as to be in contact with both the ends thereof. In other words, in a plan view, no residual layer Lbb is provided between the residual layers Lbb provided in such a manner as to be in contact with both the ends in the direction Y of the organic EL display device 30b. Note that, in the plan view of FIG. 12, a second flattening film 21b on the frame wiring line 22 is omitted.

The organic EL display device 30h of the present embodiment may be manufactured by modifying the pattern shapes of the inorganic layered film La and the residual layer Lba in the method for manufacturing the organic EL display device 30a of the above-discussed first embodiment.

The organic EL display device 30b of the present embodiment described above is able to exhibit the following effects (3) and (4) in addition to the above-discussed effects (1) and (2).

(3) In the bending region B, the peeling between a second resin film 23b and an inorganic insulating film 24a caused by the bending of a resin substrate layer 10a may occur from the end portion of the organic EL display device 30b. However, with the configuration in which the residual layers Lbb are provided at least at both the ends in the direction Y substantially orthogonal to the extension direction X of the frame wiring line 22 in the opening Sb, moisture absorption into the second resin film 23b from both the ends in the direction Y of the organic EL display device 30b is suppressed in the opening Sb. As a result, the adhesion with the inorganic insulating film 24a is maintained, and thus, the reduction in production yield of the organic EL display device 30b may be suppressed.

(4) Since the residual layers Lbb are provided only at both the ends in the direction Y of the organic EL display device 30b (that is, in a plan view, no residual layer Lbb is provided between the residual layers Lbb provided at both the ends in the direction Y of the organic display device 30b), the breakage of the residual layer Lbb caused by the bending of the resin substrate layer 10a may be prevented. As a result, the reduction in production yield of the organic EL display device 30b may be suppressed.

Third Embodiment

Figure 14:
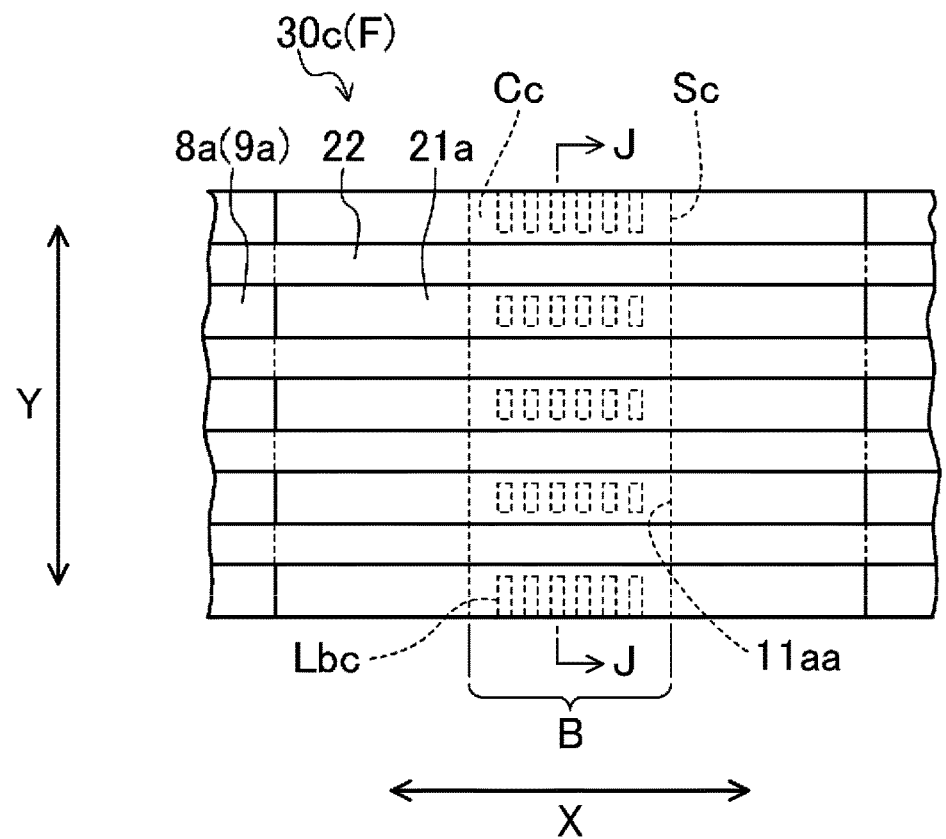
FIG. 14 is a plan view illustrating a bending region in a frame region of an organic EL display device according to a third embodiment of the disclosure, and is a view corresponding to FIG. 5.
Figure 15:
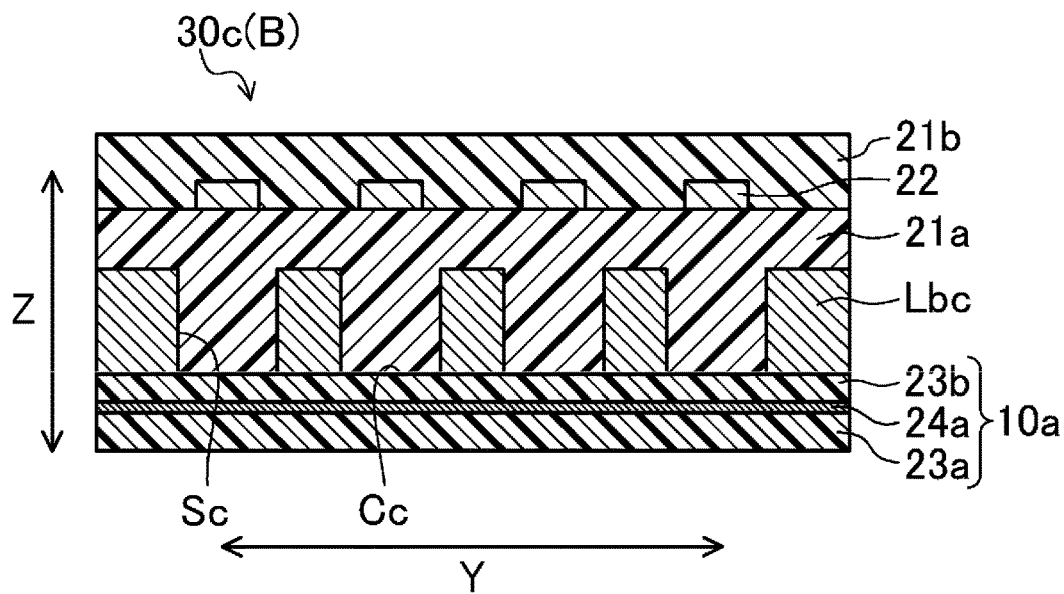
FIG. 15 is an enlarged cross-sectional view illustrating only the bending region of the organic EL display device according to the third embodiment of the disclosure taken along a line J-J in FIG. 14, and is a view corresponding to FIG. 8.

A third embodiment of the disclosure will be described below. FIG. 14 is a plan view illustrating a bending region B in a frame region F of an organic EL display device 30c according to the present embodiment, and is a view corresponding to FIG. 5. FIG. 15 is an enlarged cross-sectional view illustrating only the bending region B of the organic EL display device 30c taken along a line J-J in FIG. 14, and is a view corresponding to FIG. 8. The overall configuration, excluding the bending region B, of the organic EL display device 30c including the display region D, the frame region F, and the like is the same as that of the first embodiment described above, and therefore detailed description thereof will be omitted. Note that elements common to those in the first embodiment are denoted by the same reference signs, and duplicated description thereof will be omitted.

In the organic EL display device 30c of the present embodiment, as illustrated in FIG. 14 and FIG. 15, it is to be noted that a plurality (30 in FIG. 14) of residual layers are provided having gaps therebetween along the extension direction X of a frame wiring line 22. In other words, as illustrated in FIG. 14, the residual layer Lbc is provided as a chip formed of at least one layer of the inorganic layered film La. Note that, in the plan view of FIG. 14, a second flattening film 21b on the frame wiring line 22 is omitted.

The organic EL display device 30c of the present embodiment may be manufactured by modifying the pattern shapes of the inorganic layered film La and the residual layer Lba in the method for manufacturing the organic EL display device 30a of the above-discussed first embodiment.

The organic EL display device 30c of the present embodiment described above is able to exhibit the following effect (5) in addition to the above-discussed effects (1) and (2).

(5) In an opening Sc, the plurality of residual layers Lbc are provided having the gaps therebetween in the extension direction X of the frame wiring line 22, so that the stress exerted on the residual layer Lbc is dispersed when a resin substrate layer 10a is bent. Further, since a plurality of cutout portions Cc are provided along a bending axis direction (the direction Y substantially orthogonal to the extension direction X of the frame wiring line 22) of the resin substrate layer 10a, the stress exerted on the residual layer Lbc is further reduced when the resin substrate layer 10a is bent. As a result, since the breakage of the residual layer Lbc caused by the bending of the resin substrate layer 10a can be further suppressed in the bending region B, the reduction in production yield of the organic EL display device 30c may be suppressed.

Fourth Embodiment

Figure 16:
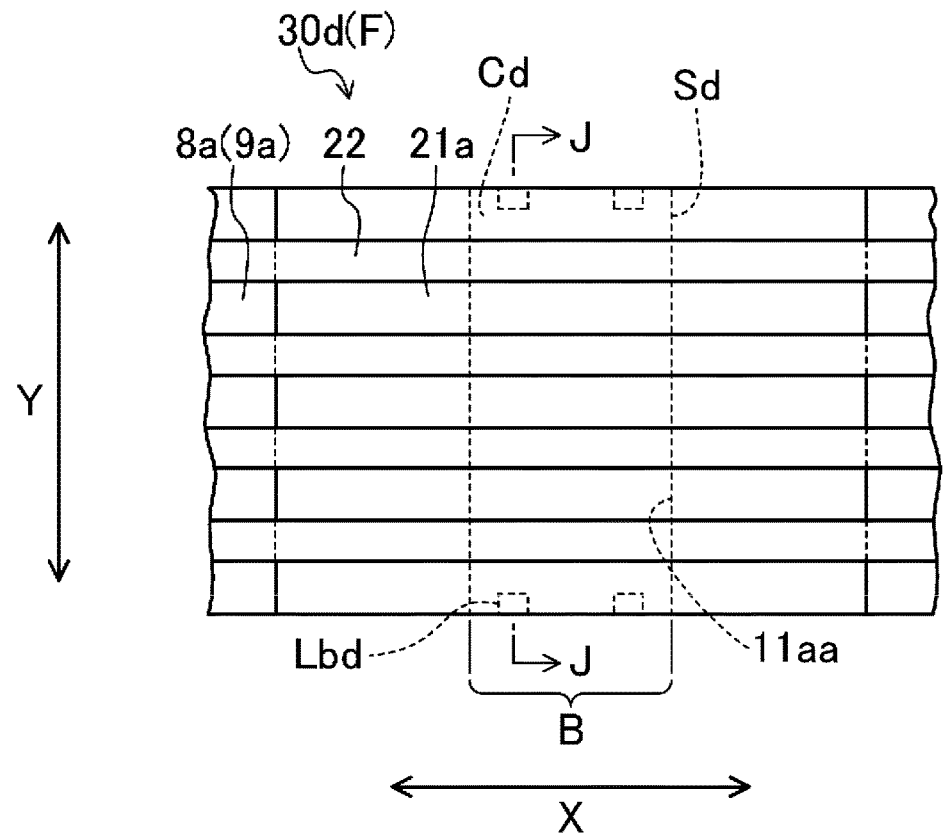
FIG. 16 is a plan view illustrating a bending region in a frame region of an organic EL display device according to a fourth embodiment of the disclosure, and is a view corresponding to FIG. 5.
Figure 17:
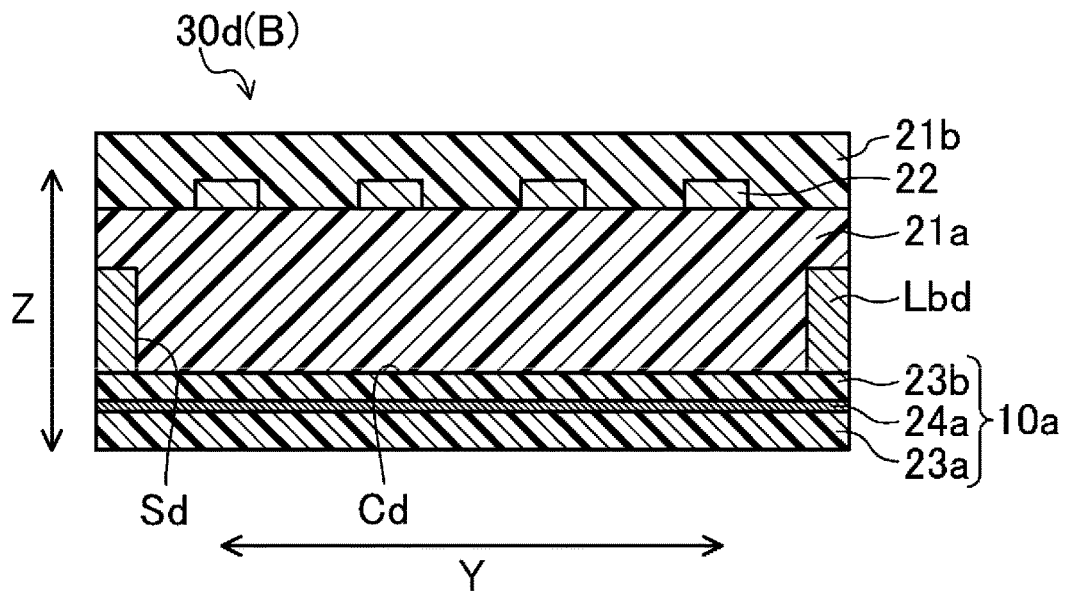
FIG. 17 is an enlarged cross-sectional view illustrating only the bending region of the organic EL display device according to the fourth embodiment of the disclosure taken along a line J-J in FIG. 16, and is a view corresponding to FIG. 8.

A fourth embodiment of the disclosure will be described below. FIG. 16 is a plan view illustrating a bending region B in a frame region F of an organic EL display device 30d according to the present embodiment, and is a view corresponding to FIG. 5. FIG. 17 is an enlarged cross-sectional view illustrating only the bending region B of the organic EL display device 30d taken along a line J-J in FIG. 16, and is a view corresponding to FIG. 8. The overall configuration, excluding the bending region B, of the organic EL display device 30d including the display region D, the frame region F, and the like is the same as that of the first embodiment described above, and therefore detailed description thereof will be omitted. Note that elements common to those in the first embodiment are denoted by the same reference signs, and duplicated description thereof will be omitted.

As illustrated in FIG. 16 and FIG. 17, the organic EL display device 30d of the present embodiment is such that, in the organic EL display device 30b of the above-discussed second embodiment, a plurality (four in FIG. 16) of residual layers Lbd are provided having gaps therebetween along the extension direction X of a frame wiring line 22, In other words, as illustrated in FIG. 16, the residual layer Lbd, similar to the residual layer Lbc of the organic EL display device 30c of the above-discussed third embodiment, is provided as a chip formed of at least one layer of the inorganic layered film La. Note that, in the plan view of FIG. 16, a second flattening film 21b on the frame wiring line 22 is omitted.

In the present embodiment, the residual layers Lbd in an opening Sd are provided extending from both ends of the organic EL display device 30d in the direction Y substantially orthogonal to the extension direction X of the frame wiring line 22 with a minimum necessary range in which moisture absorption into a second resin film 23b is suppressed.

The organic EL display device 30d of the present embodiment may be manufactured by modifying the pattern shapes of the inorganic layered film La and the residual layer Lba in the method for manufacturing the organic EL display device 30a of the above-discussed first embodiment.

The organic EL display device 30d of the present embodiment described above is able to exhibit the following effect (6) in addition to the above-discussed effects (1) and (2).

(6) In an opening Sd, the plurality of residual layers Lbd are provided at only both the ends in the direction Y substantially orthogonal to the extension direction X of the frame wiring line 22, and are also provided having the gaps therebetween along the direction X, thereby making it possible to further reduce the stress exerted on the residual layer Lbd in the bending region B when a resin substrate layer 10a is bent, and to further protect the breakage of the residual layer Lbd caused by the bending of the resin substrate layer 10a. As a result, the reduction in production yield of the organic EL display device 30d may be suppressed.

Fifth Embodiment

Figure 18:
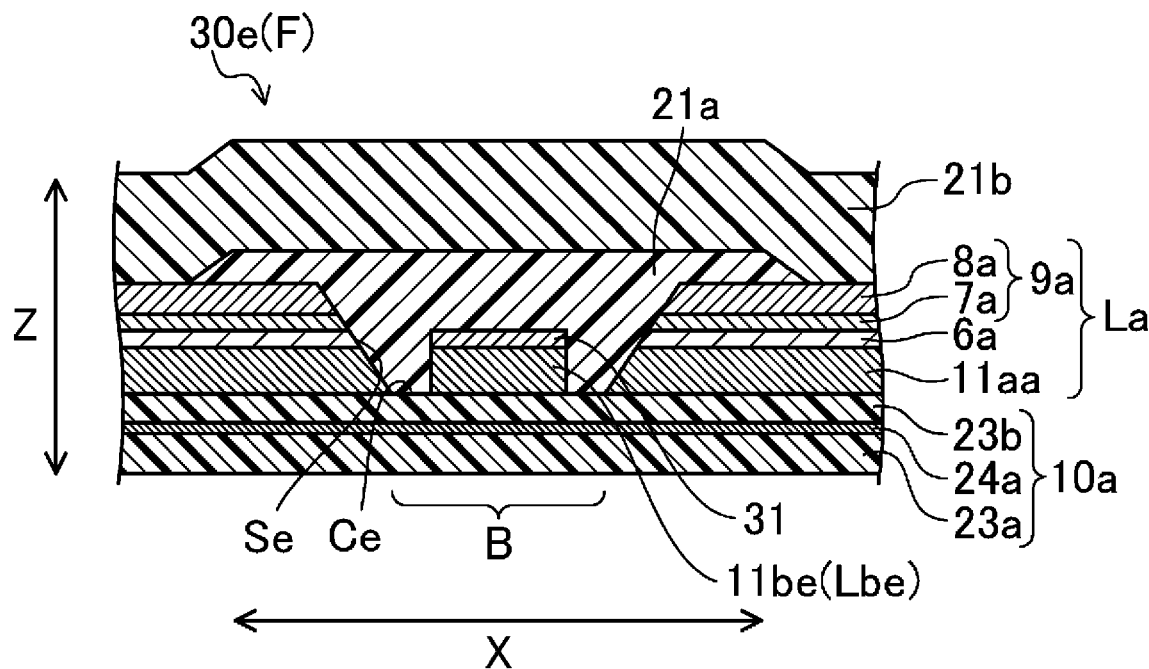
FIG. 18 is a cross-sectional view illustrating a bending region of an organic EL display device according to a fifth embodiment of the disclosure, and is a view corresponding to FIG. 7.

A fifth embodiment of the disclosure will be described below. FIG. 18 is a cross-sectional view illustrating a bending region B of an organic EL display device 30e according to the present embodiment, and is a view corresponding to FIG. 7. The overall configuration, excluding the bending region B, of the organic EL display device 30e including the display region D, the frame region F, and the like is the same as that of the first embodiment described above, and therefore detailed description thereof will be omitted. Note that elements common to those in the first embodiment are denoted by the same reference signs, and duplicated description thereof will be omitted.

In the organic EL display device 30e of the present embodiment, as illustrated in FIG. 18, a residual layer Lbe in an opening Se is constituted by a base coat film 11be formed of a base coat film 11aa of an inorganic layered film La, a semiconductor layer 31 is provided on a front face of the base coat film 11 be, and the semiconductor layer 31 is in contact with a first flattening film 21a.

The semiconductor layer 31 is constituted of a silicon material forming the base coat film 11aa and the like, an oxide forming the first electrode 14 or the second electrode 17, and the like.

The organic EL display device 30e of the present embodiment may be manufactured by forming the semiconductor layer 31 in an island shape, in a plan view, in the bending region B when patterning the semiconductor in the method for manufacturing the organic EL display device 30a of the above-discussed first embodiment. In this case, there is no need to form a resist that is necessary when etching is performed on the inorganic layered film La to provide the residual layer Lbe in the bending region B. A first interlayer insulating film 7be and a second interlayer insulating film She on the semiconductor layer 31 are removed by etching.

The organic EL display device 30e of the present embodiment described above is able to exhibit the following effects (7) and (8) in addition to the above-discussed effects (1) and (2).

(7) By providing the semiconductor layer 31 on the front face of the residual layer Lbe in the opening Se, the semiconductor layer 31 functions as a stopper for etching, thereby making it possible to provide the residual layer Lbe without forming a resist on the inorganic layered film La.

(8) Since the first interlayer insulating film 7be and the second interlayer insulating film She on the semiconductor layer 31 are removed by etching, the stress exerted on the residual layer Lbe may be further reduced when the resin substrate layer 10a is bent in the bending region B. As a result, the reduction in production yield of the organic EL display device 30e may be suppressed.

Sixth Embodiment

Figure 19:
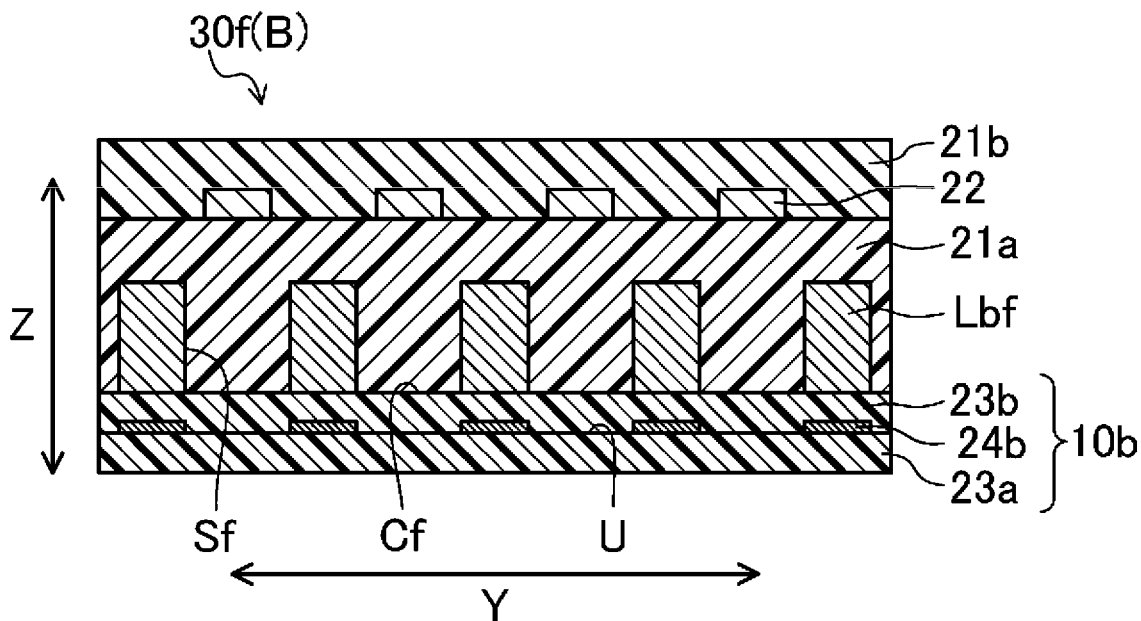
FIG. 19 is an enlarged cross-sectional view illustrating only a bending region of an organic EL display device according to a sixth embodiment of the disclosure, and is a view corresponding to FIG. 8.

A sixth embodiment of the disclosure will be described below. FIG. 19 is an enlarged cross-sectional view illustrating only a bending region B of an organic EL display device 30f according to the present embodiment, and is a view corresponding to FIG. 8. The overall configuration, excluding the bending region B, of the organic EL display device 30f including the display region D, the frame region F, and the like is the same as that of the first embodiment described above, and therefore detailed description thereof will be omitted. Note that elements common to those in the first embodiment are denoted by the same reference signs, and duplicated description thereof will be omitted.

In the organic EL display device 30f of the present embodiment, as illustrated in FIG. 19, a substrate-side opening U is formed in an inorganic insulating film 24b of a resin substrate layer 10b in such a manner as to overlap, in a plan view, with a portion where a residual layer Lbf is not provided in an opening Sf (that is, a cutout portion Cf).

In the substrate-side opening U in the inorganic insulating film 24b, a first resin film 23a is exposed, and a second resin film 23b is provided so that the first resin film 23a and the second resin film 23b are configured to be in direct contact with each other. In other words, the substrate-side opening U is a through-hole that establishes the direct contact between the first resin film 23a and the second resin film 23b.

The organic EL display device 30f of the present embodiment may be manufactured, for example, by forming the resin substrate layer 10b in the following manner in the method for manufacturing the organic EL display device 30a of the first embodiment described above. After the inorganic insulating film 24a is formed on the first resin film 23a, a photosensitive organic insulating film such as a polyimide resin film is film-formed only in the bending region B and patterned in a predetermined shape.

The organic EL display device 30f of the present embodiment described above is able to exhibit the following effect (9) in addition to the above-discussed effects (1) and (2).

(9) In the opening Sf, since the substrate-side opening U is formed in the inorganic insulating film 24b of the resin substrate layer 10b in such a manner as to overlap with the cutout portion Cf in the plan view, the stress exerted on the residual layer Lbf when the resin substrate layer 10a is bent may be further reduced in the bending region B. As a result, the reduction in production yield of the organic EL display device 30f may be suppressed.

Other Embodiments

In the first to fourth embodiments and the sixth embodiment, the residual layer Lb is constituted of four layers in which the gate insulating film 6b, the first interlayer insulating film 7b, and the second interlayer insulating film 8b are layered in that order on the front face of the base coat film 11b. However, the residual layer Lb may be constituted of a single layer of the base coat film 11b, or may be constituted of two layers of the base coat film 11b and the gate insulating film 6b.

In the fifth embodiment described above, the residual layer Lbe is constituted of a single layer of the base coat film 11be, but may be constituted of two layers in which a gate insulating film 6be is layered on the front face of the base coat film 11be.

The foregoing embodiments describe an example of the organic EL layer having a five-layer structure including the hole injection layer, the hole transport layer, the light-emitting layer, the electron transport layer, and the electron injection layer. However, for example, the organic EL layer may have a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device, in which the layers of the structure of the organic EL layer are in the reverse order, with the first electrode being a cathode and the second electrode being an anode.

In each of the embodiments described above, the organic EL display device including an element substrate, in which the electrode of the TFT connected to the first electrode serves as the drain electrode, is exemplified. The disclosure is also applicable to an organic EL display device including an element substrate, in which the electrode of the TFT connected to the first electrode is referred to as the source electrode.

Although the foregoing embodiments describe organic EL display devices as examples of display devices, the disclosure can be applied in display devices including a plurality of light-emitting elements that are driven by an electrical current. For example, the disclosure is applicable to display devices including quantum dot light-emitting diodes (QLEDs), which are light-emitting elements using a quantum dot-containing layer.

INDUSTRIAL APPLICABILITY

As described above, the disclosure is useful for a flexible display device.

The invention claimed is:
1. A display device comprising:
a resin substrate in which a first resin film, an inorganic insulating film, and a second resin film are layered in an order of the first resin film, the inorganic insulating film, and the second resin film;
a light-emitting element included in a display region that is provided over the resin substrate with a TFT layer interposed between the display region and the resin substrate;
a frame region provided in a periphery of the display region;
a terminal section provided at an end portion of the frame region;
a bending region provided between the display region and the terminal section;
at least one layer of an inorganic film provided in the frame region and included in the TFT layer that is layered on a front face of the resin substrate;
a frame flattening film provided on the front face of the resin substrate to cover the inorganic film; and
a frame wiring line that is provided on a front face of the inorganic film and a front face of the frame flattening film, is connected to the light-emitting element, and is extended to the terminal section,
wherein in the bending region, an openings is formed in the inorganic film, a plurality of residual layers of the inorganic film are provided in island shapes in the opening in a plan view, and the frame wiring line is disposed between the residual layers adjacent to each other.

2. The display device according to claim 1,
wherein the residual layers do not overlap with the frame wiring line in a plan view.

3. The display device according to claim 2,
wherein the residual layers are provided at a portion where the frame wiring line is not disposed in a plan view.

4. The display device according to claim 3,
wherein the plurality of residual layers are provided having gaps between the residual layers along an extension direction of the frame wiring line.

5. The display device according to claim 3,
wherein the residual layers are provided at least at both ends in a direction substantially orthogonal to an extension direction of the frame wiring line.

6. The display device according to claim 5,
wherein the residual layers are provided only at both the ends in the direction substantially orthogonal to the extension direction of the frame wiring line.

7. The display device according to claim 6,
wherein the plurality of residual layers are provided having gaps between the residual layers along the extension direction of the frame wiring line.

8. The display device according to claim 1,
wherein the inorganic film comprises four layers in which a first inorganic layer to a fourth inorganic layer are layered in sequence,
the residual layers comprise at least one layer selected from the first to fourth inorganic layers, and
the frame wiring line is provided on the front face of the frame flattening film and on a front face of the fourth inorganic layer.

9. The display device according to claim 8,
wherein the residual layers comprise the first inorganic layer, and
a semiconductor layer is provided on a front face of the residual layers, and the semiconductor layer is in contact with the frame flattening film.

10. The display device according to claim 1,
wherein a substrate-side opening is formed in the inorganic insulating film of the resin substrate in such a manner that the substrate-side opening overlaps, in a plan view, with a portion where the residual layers are not provided in the opening.

11. The display device according to claim 1,
wherein at a portion where the residual layers are not provided in the opening, the second resin film is in contact with the frame flattening film.

12. The display device according to claim 1,
wherein the light-emitting element is an organic EL element.

* * * * *